United States Patent
Burlison et al.

(10) Patent No.: US 8,127,186 B2
(45) Date of Patent: *Feb. 28, 2012

(54) METHODS AND APPARATUS FOR ESTIMATING A POSITION OF A STUCK-AT DEFECT IN A SCAN CHAIN OF A DEVICE UNDER TEST

(75) Inventors: Phillip D. Burlison, Morgan Hill, CA (US); John K. Frediani, Corralitos, CA (US)

(73) Assignee: Verigy (Singapore) Pte. Ltd., Singapore (SG)

(*) Notice: Subject to any disclaimer, the term of this patent is extended or adjusted under 35 U.S.C. 154(b) by 746 days.

This patent is subject to a terminal disclaimer.

(21) Appl. No.: 12/074,015

(22) Filed: Feb. 28, 2008

(65) Prior Publication Data

US 2008/0215940 A1 Sep. 4, 2008

Related U.S. Application Data

(63) Continuation-in-part of application No. 11/680,134, filed on Feb. 28, 2007, now Pat. No. 7,650,547.

(51) Int. Cl.
 *G01R 31/3183* (2006.01)
 *G01R 31/40* (2006.01)
(52) U.S. Cl. .................... 714/726; 714/724
(58) Field of Classification Search .............. None
See application file for complete search history.

(56) References Cited

U.S. PATENT DOCUMENTS

| | | | |
|---|---|---|---|
| 4,255,789 A | 3/1981 | Hartford et al. | |
| 5,657,232 A | 8/1997 | Ishikawa et al. | |
| 5,951,705 A | 9/1999 | Arkin et al. | |
| 6,662,324 B1 | 12/2003 | Motika et al. | |
| 6,947,484 B2 | 9/2005 | Inagaki et al. | |
| 6,966,021 B2 | 11/2005 | Rajski et al. | |
| 7,650,547 B2 * | 1/2010 | Burlison et al. | 714/726 |
| 2005/0055615 A1 | 3/2005 | Agashe et al. | |
| 2005/0172188 A1 | 8/2005 | Burdine | |
| 2006/0075316 A1 | 4/2006 | Chindamo et al. | |
| 2006/0095818 A1 | 5/2006 | Bratt et al. | |
| 2007/0016833 A1 | 1/2007 | Lin | |
| 2007/0220384 A1 | 9/2007 | Bartenstein et al. | |
| 2008/0215940 A1 | 9/2008 | Burlison et al. | |

OTHER PUBLICATIONS

U.S. Appl. No. 11/680,134, filed Feb. 28, 2007, Burlison, et al.
U.S. Appl. No. 11/609,899, filed Dec. 12, 2006, Richard C. Dokken.
Office Action mailed Feb. 10, 2009 for U.S. Appl. No. 11/980,134.
International Search Report issued on Jun. 25, 2008 for application No. PCT/US2008/02765.
Written Opinion of the International Searching Authority issued on Jun. 25, 2008 for application No. PCT/US2008/02765.

* cited by examiner

*Primary Examiner* — Cynthia Britt
*Assistant Examiner* — Dipakkumar Gandhi
(74) *Attorney, Agent, or Firm* — Holland & Hart, LLP

(57) ABSTRACT

As a scan pattern is shifted out of a scan chain, the scan pattern is evaluated in real-time for the existence of a logic condition. A reference to a portion of the scan pattern that is currently being evaluated is maintained. Upon identifying the existence of the logic condition when the reference has a predetermined relationship to a stored value, the stored value is overwritten using the reference. The stored value is then used to estimate the position of a stuck-at defect in the scan chain.

21 Claims, 15 Drawing Sheets

METHODS AND APPARATUS FOR ESTIMATING A POSITION OF A STUCK-AT DEFECT IN A SCAN CHAIN OF A DEVICE UNDER TEST

CROSS-REFERENCE TO RELATED APPLICATION

This application is a continuation-in-part of application Ser. No. 11/680,134, filed Feb. 28, 2007 now U.S. Pat. No. 7,650,547, which is hereby incorporated by reference.

BACKGROUND

Digital logic consists of combinational logic functions and sequential logic functions. In combinational logic functions, the digital output(s) is determined by the present data state of its input data signals. Any change in an input data state of a combinational logic function results in an immediate change in the function's output data state. Examples of combinational logic functions are AND gates (a TRUE state on ALL inputs results in a TRUE state on the output), OR gates (a TRUE state on ANY input results in a TRUE state on the output), and multiplexers (the output state is derived from one of a set of inputs that is selected from another set of inputs). Sequential logic functions differ in that an output data (Q) state can maintain a data state that is dependent on the input data states that were applied in the past. The most commonly used sequential logic function is the flip-flop. A flip-flop's output data (Q) state changes only when there is a positive transition of its input clock (C) signal. At the time of this transition, the output data (Q) state changes to the state of its input data (D) signal. After the clock signal transition, the output data (Q) state maintains its state regardless of the state of the input data (D) signal. Each clock transition is referred to as a data cycle. Normally these data cycles occur at regularly scheduled intervals which represent the effective data rate of a circuit. Normal operation of the circuit will typically involve millions of data cycles.

To add testability to a circuit, flip-flops can be modified to facilitate the setting and reading of their data states using a data path that is independent of the data paths through combinational logic. This is referred to as Design For Test (DFT). FIG. 1 depicts a circuit 100 comprising four flip-flops 102, 104, 106, 108, with the combinational logic 110 of the circuit 100 enclosed in a "black box" for simplicity. FIG. 2 depicts a similar circuit 200 having a scan (or DFT structure) implemented therein. The scan chain is created by adding a signal multiplexer 202, 204, 206, 208 before the data input (D) of each flip-flop 102, 104, 106, 108. A single control signal called Scan Enable is added to control the selection of these multiplexers. When the Scan Enable signal is low, the circuit works as normal, meaning the data input to the flip-flops comes from the combinational logic 110 (e.g., data DO). When the Scan Enable signal is high, the input of each flip-flop 102, 104, 106, 108 is connected to the output of another flip-flop, or to an external pin (Scan Out) of the circuit 200. The data input to the first flip-flop 102 in the scan chain is also brought out to an external pin (Scan In) of the circuit 200. FIG. 3 depicts how this implementation facilitates the shifting in of a test pattern on the Scan In pin to every flip-flop 102, 104, 106, 108 in the circuit 200. After the test pattern is shifted in, the Scan Enable signal is brought low for one cycle, and the data outputs of the combinational logic 110 resulting from the shifted in test pattern are captured in the flip-flops 102, 104, 106, 108. The Scan Enable signal is then brought back high and the captured data results are shifted out of the Scan Out pin and compared against expected results by a test system. Any operational defect in the combinational logic 110 will cause one or more bits of the data output sequence to differ from the expected results.

Building upon the illustration of the principle discussed above, a typical device under test (e.g., an integrated circuit (IC)) might have thousands of flip-flops in each scan chain, and employ multiple scan chains. Also there are commonly several thousand different scan patterns applied in a test (a single pattern refers to the complete set of sequential data that is shifted into each flip-flop, requiring that each pattern contain one unique data state for each flip-flop in the design). This results in an extremely large volume of test data that is applied to and tested for during the testing of a complex device. Moreover the multiple scan chains within a device will rarely if ever have exactly identical length, so a test pattern will frequently have "don't care" states.

The role of DFT testing (or structural testing) may be to verify that a device is free of any manufacturing defects. During the execution of a test pattern, if a data state is detected that is different than the expected data state, it may be economical to terminate the test and categorize the IC as defective. However it may also be desirable to capture all failing data states in all patterns for the purpose of subsequently diagnosing the failures and determining which combinational logic element caused the fault. This diagnosis is normally done by a separate software program that analyzes the results captured by a test system (e.g., captured by automatic test equipment (ATE)). Thus, the automatic test equipment must be able to record the information required to perform this post analysis process.

FIG. 4 illustrates a device 400 having multiple scan chains, and FIG. 5 depicts an exemplary test system 500 for executing structural tests (also known as scan tests or DFT tests) of the device 400. A Data Pattern Memory is loaded with the test patterns to be applied to the device 400 and the data patterns expected to be read from the device. The test system 400 may have a selectable mode, for either 1) terminating the test whenever an error occurs (e.g., when an output data state differs from an expected data state), or 2) completing the entire pattern set and recording all of the errors that are observed. To accomplish this, a test system needs to have a Data Capture Memory. This memory may record the data cycle count and output pin for which an error is observed. Another mode of the Data Capture Memory is to record the raw (actual) states read from the scan outputs of the device 400.

A single fault in the combinational logic 110 may lead to several thousand errors that potentially need to be recorded in the Data Capture Memory. As an example, consider an IC design that has 20,000 flip-flops in each scan chain, and a test system that applies 10,000 scan patterns. In such a scenario, a single combinational logic fault might cause 10 flip-flops to fail in 25% of the patterns. This would result in 25,000 failures being recorded in the Data Capture Memory. While non-trivial, this data can be managed to a reasonable degree and "datalogged" to a file for post-processing to determine the location of the combinational logic fault.

However, a fault that exists in a scan chain path itself creates a significantly different diagnosis problem. FIG. 6 depicts the circuit 200 with a single "short" at the scan input to the multiplexer 204 preceding flip-flop 104. This defect will cause all scan data downstream of the "stuck-at" fault to have a logic "0" state. That is, logic "0"s will fill the flip-flops 104, 106 and 108 as the clock signal is toggled. The stuck-at defect therefore has two repercussions: 1) the test pattern applied to the combinational logic will be invalid, and 2) upon scanning a captured test pattern out of the Scan Out pin, the stuck-at defect (or blockage) creates an inability to observe any data captured in flip-flop 102. The result is a tremendous number of fails.

BRIEF DESCRIPTION OF THE DRAWINGS

Illustrative embodiments of the invention are illustrated in the drawings, in which.

Figure 1:
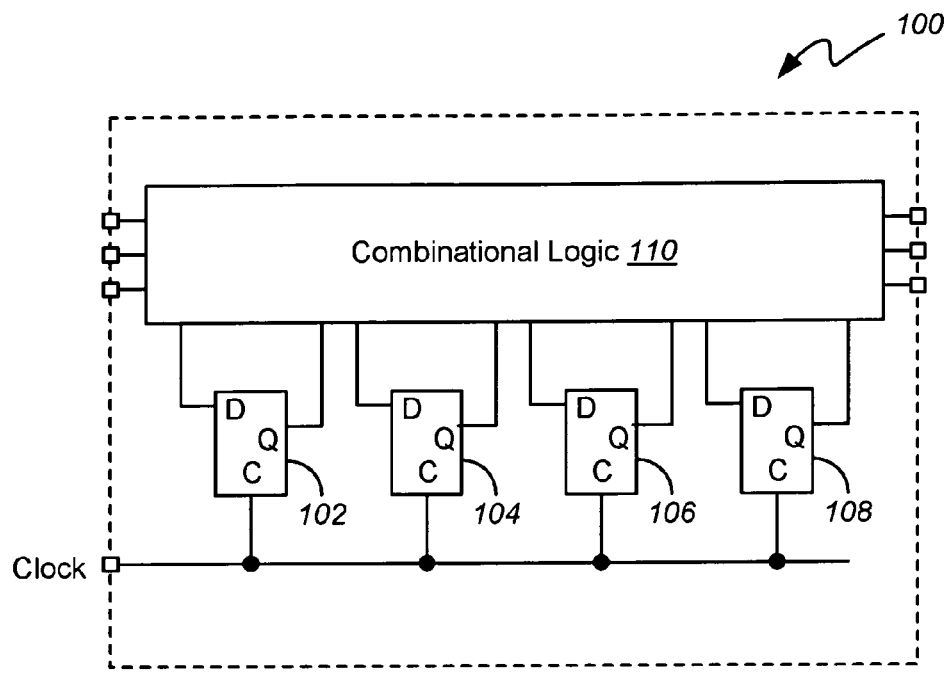
FIG. 1 illustrates an exemplary device without DFT circuitry.
Figure 2:
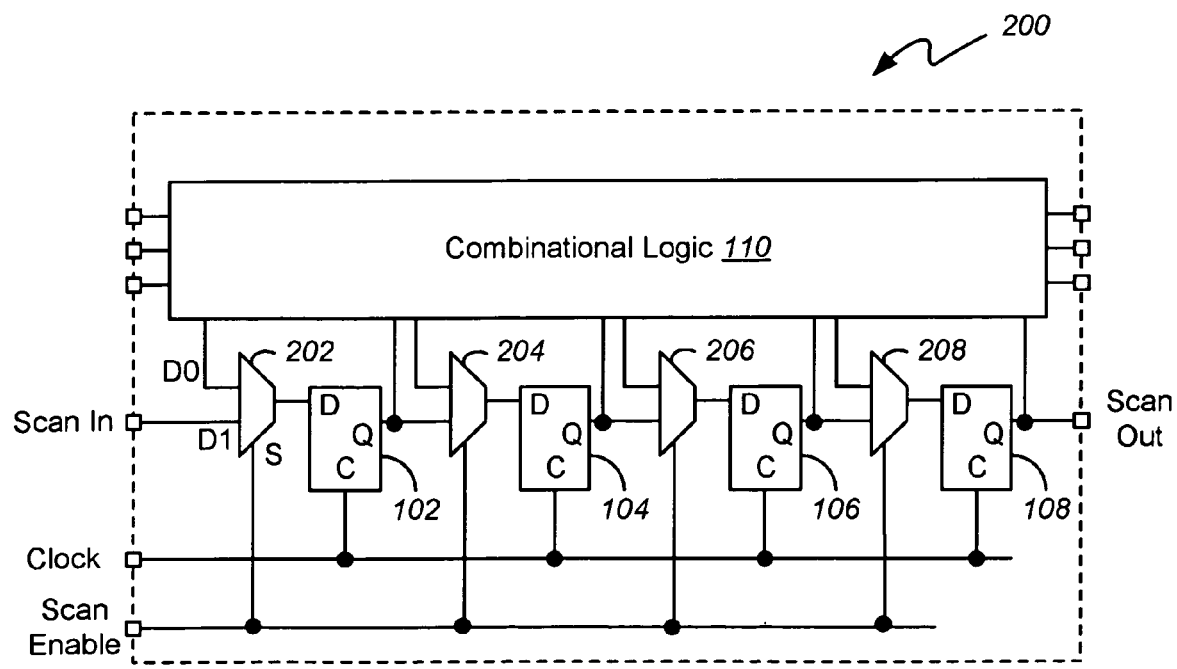
FIG. 2 illustrates an exemplary device with DFT circuitry.
Figure 3:
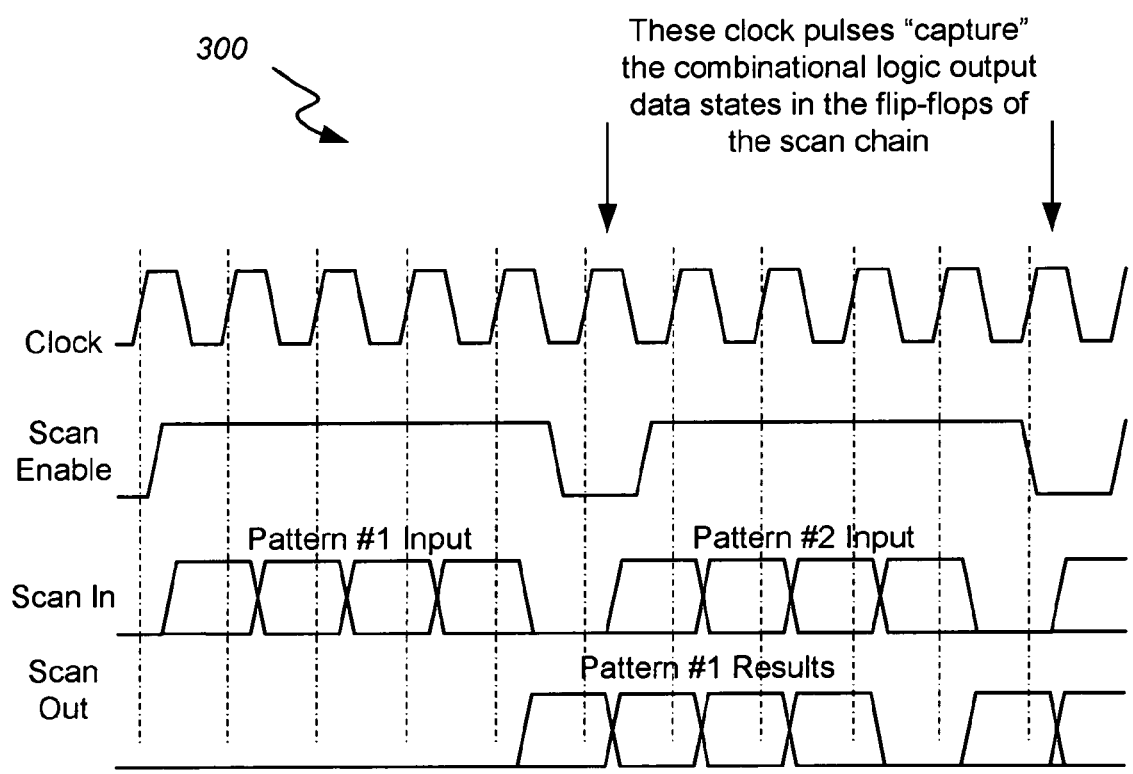
FIG. 3 illustrates exemplary waveforms for a scan clock, a scan enable signal, and scan data signals.
Figure 4:
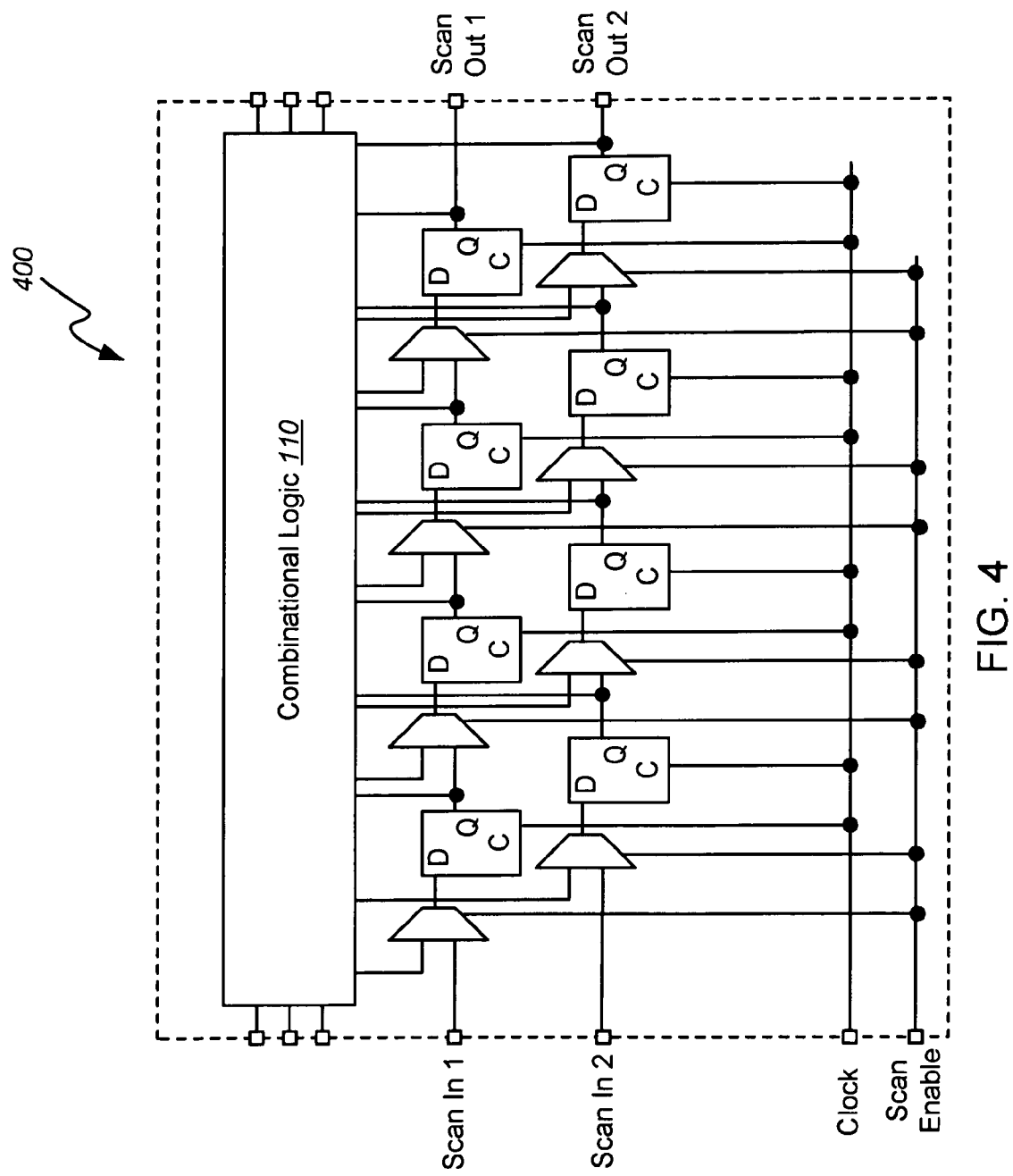
FIG. 4 illustrates an exemplary device having two scan chains.
Figure 5:
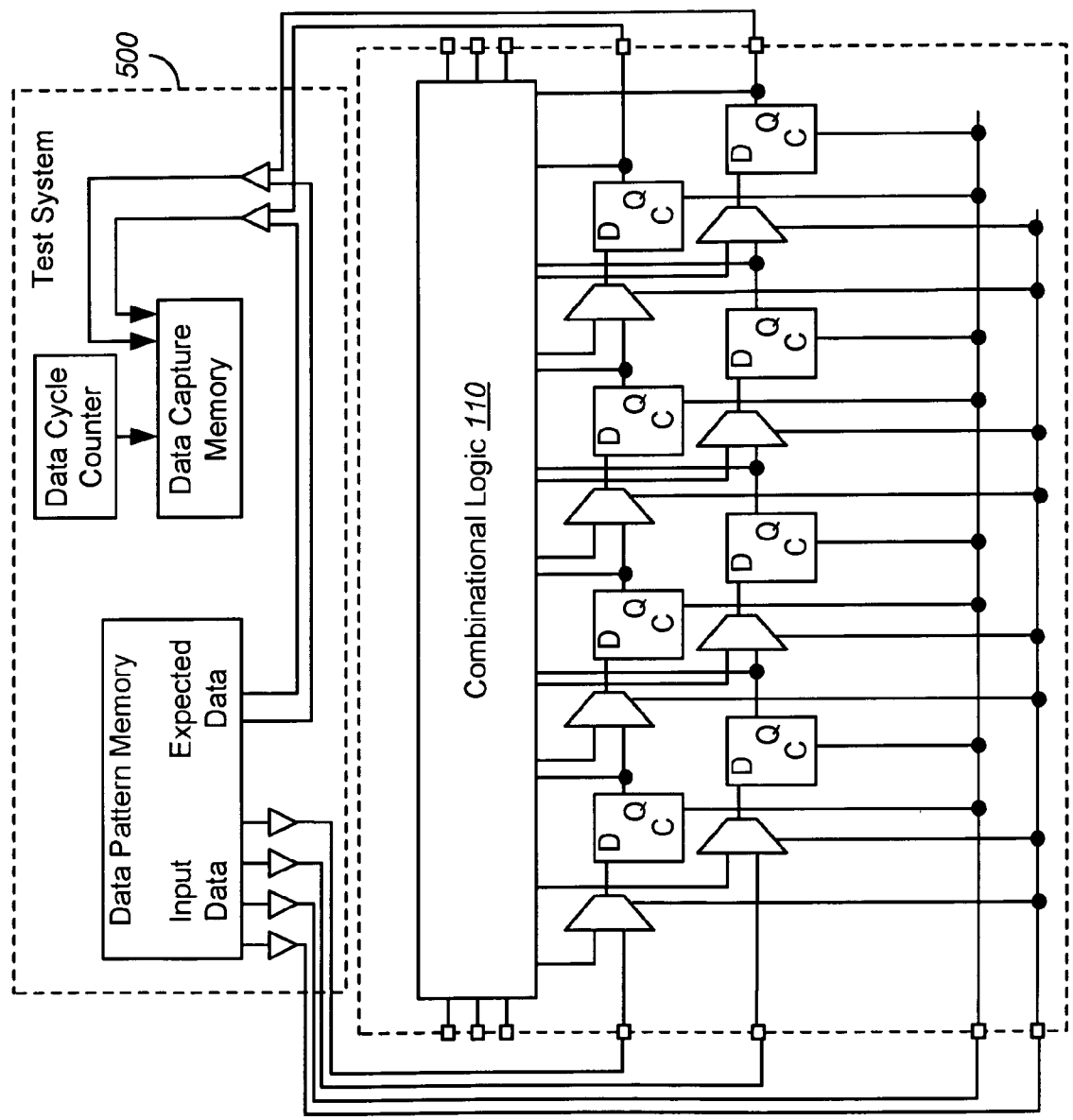
FIG. 5 illustrates an exemplary test system coupled to an exemplary device under test.
Figure 6:
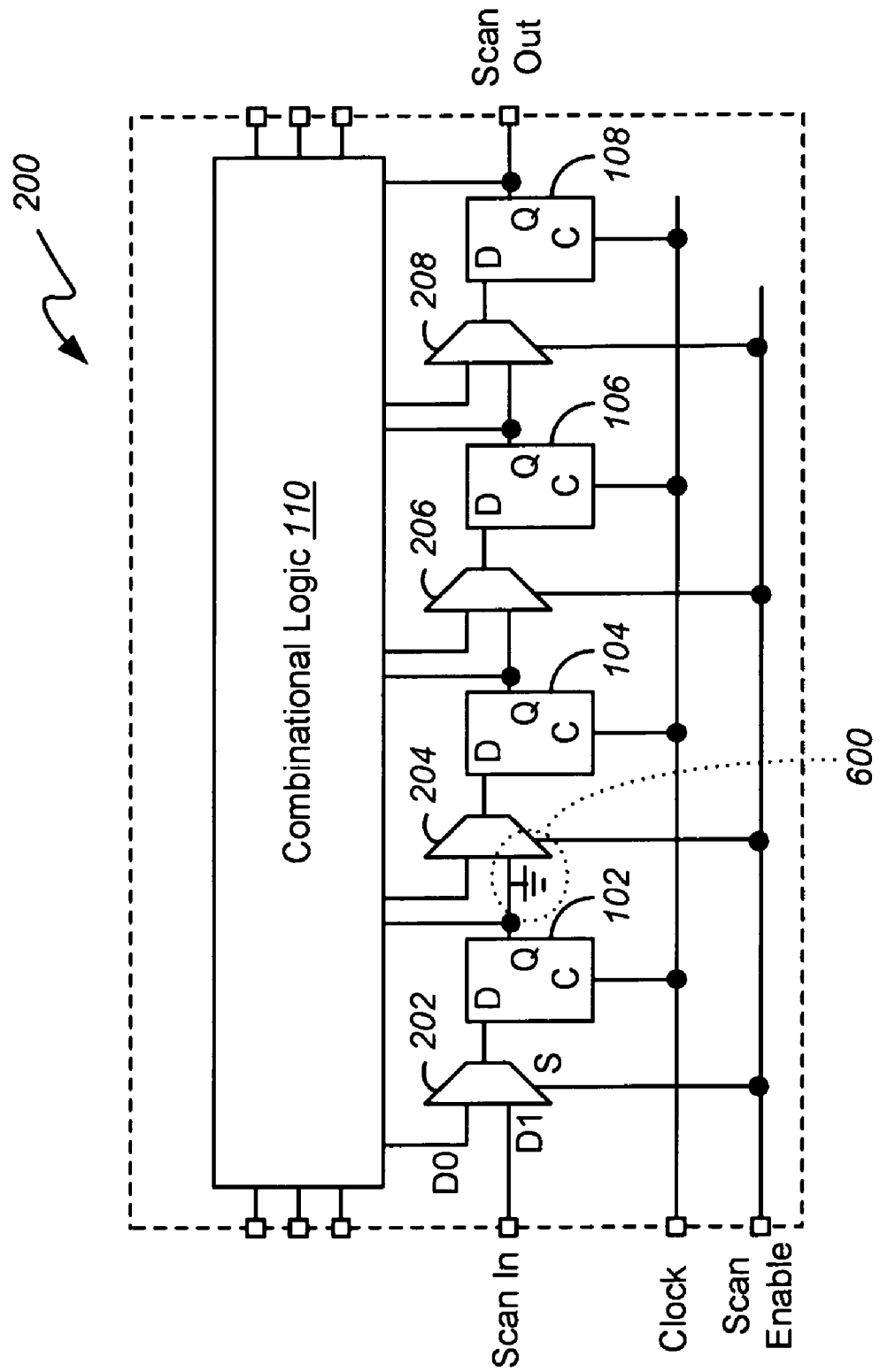
FIG. 6 illustrates an exemplary stuck-at defect in a scan chain.

It is noted that, in the following description, like reference numbers appearing in different drawing figures refer to like elements/features. Often, therefore, like elements/features that appear in different drawing figures will not be described in detail with respect to each of the drawing figures.

DETAILED DESCRIPTION

Figure 7:
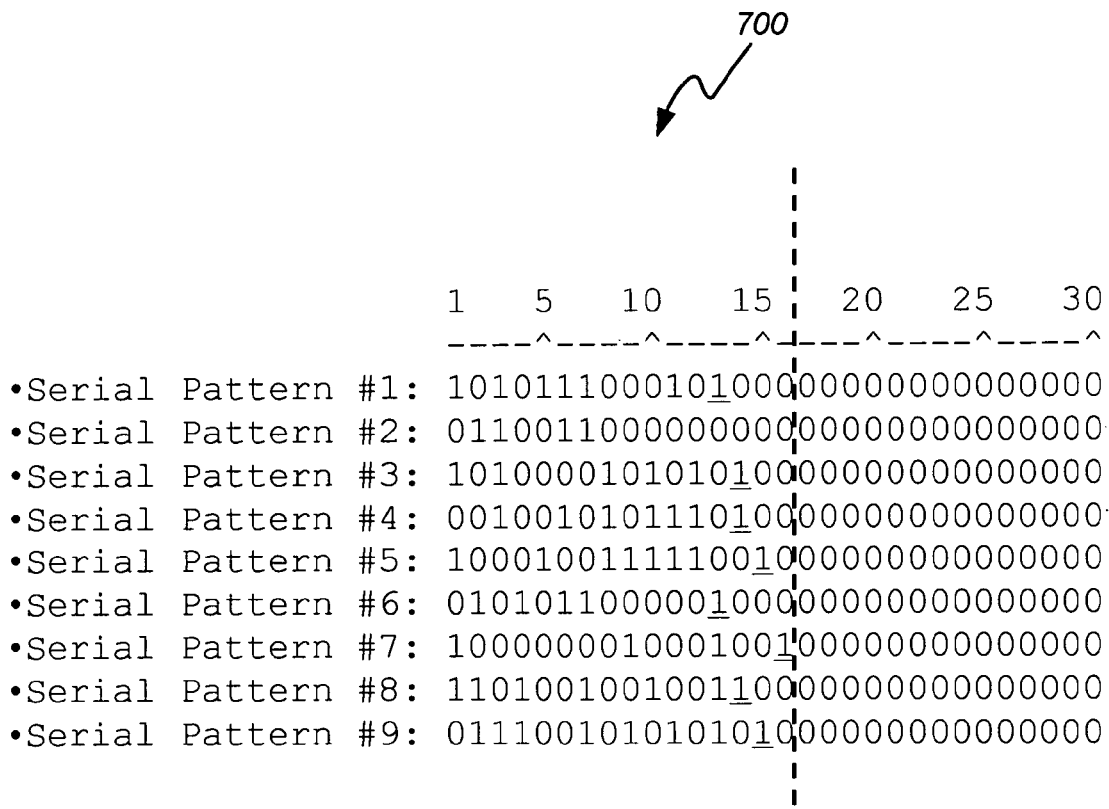
FIG. 7 illustrates an exemplary data log of scan patterns shifted out of a scan chain having a stuck low defect.

FIG. 7 illustrates an exemplary data log of scan patterns that are shifted out of a 30 flip-flop scan chain having a stuck low defect at the input to flip-flop #16 of the scan chain (where flip-flop #1 is the flip-flop closest to the Scan Out pin of the scan chain). As one can see, when applying a set of scan patterns to the scan chain, the "capture" events will capture non-deterministic data states from the combinational logic to which the flip-flops are coupled. The data is non-deterministic because of the invalid test pattern data after flip-flop #15. The non-deterministic "0" and "1" data states captured in flip-flops #1-15 will be observed when shifting out the data, but all captured data in flip-flops #16-30 will be read as "0" data states. By observing at what cycle location in the output data stream the data stops transitioning between "1"s and "0"s, one can make an estimate of the scan chain position at which the fault exists.

Figure 8:
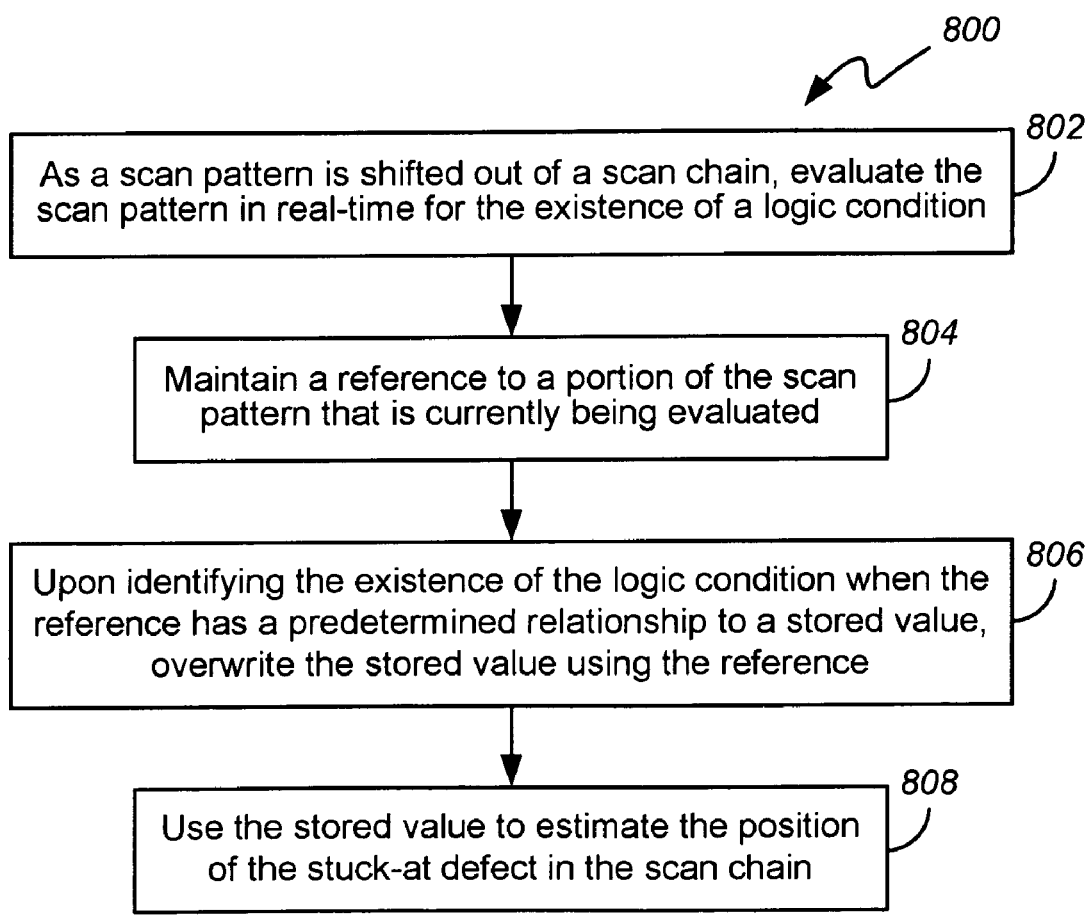
FIG. 8 illustrates a first exemplary method for estimating a position of a stuck-at defect in a scan chain.

FIG. 8 illustrates an exemplary method 800 for determining a position of a stuck-at defect in a scan chain of a device under test. The method 800 comprises the step of evaluating a scan pattern shifted out of the scan chain for the existence of a logic condition (at block 802). The scan pattern is evaluated in real-time, as the scan pattern is shifted out of the scan chain. While the scan pattern is being evaluated, a reference to a portion of the scan pattern that is currently being evaluated is maintained (at block 804). Upon identifying the existence of the logic condition when the reference has a predetermined relationship to a stored value, the stored value is overwritten using the reference (at block 806). The stored value is then used to estimate the position of the stuck-at defect in the scan chain (at block 808).

The logic condition for which the scan chain is evaluated may be, for example, a logic level, such as a logic high or logic low level, or a logic transition, such as a low-to-high or high-to-low transition.

The method 800 is useful, in one respect, in that it can be used to determine the position of a stuck-at defect in a scan chain, but do so without having to store all of the bits (or bit failures) of one or more scan patterns in the data capture memory of a test system.

As indicated in the above discussion of method 800, the value stored by the method 800 is used to "estimate" the position of the stuck-at defect in the scan chain. Although the goal of the method 800 is to hopefully identify a precise position of the stuck-at defect, the method 800 can, in reality, only estimate the position. This is because the "stored value" is indicative of a position in a scan pattern where one or more bits that are presumed to have non-deterministic logic levels abut one or more bits that are presumed to have a "stuck-at" logic level. However, the non-deterministic logic levels, by their very nature, may comprise one or more bits of data that 1) abut the bits having the stuck-at logic level, and 2) have the same logic level as the stuck-at logic level. Because of this, the probability of the estimated stuck-at position being correct can be increased by shifting multiple different scan patterns into a scan chain, launching each of the scan patterns, shifting out multiple responsive scan patterns, and evaluating each of the shifted-out scan patterns for the logic condition. This is illustrated by the method 900 shown in FIG. 9.

The method 900 is similar to the method 800. However, the method 900 includes a step of initializing a memory holding the "stored value" (at block 902). As shown, the memory is initialized prior to any of a plurality of scan patterns being evaluated for a logic condition, but not between evaluating individual ones of the plurality of scan patterns for the logic condition. After initializing the memory, the evaluating, maintaining, identifying and overwriting steps of method 800 (i.e., blocks 802, 804 and 806) are repeated for each of the plurality of scan patterns (at block 904). After repeating the evaluating, maintaining, identifying and overwriting steps, the stored value is used to estimate the position of the stuck-at defect in the scan chain (at block 808).

Figure 10:
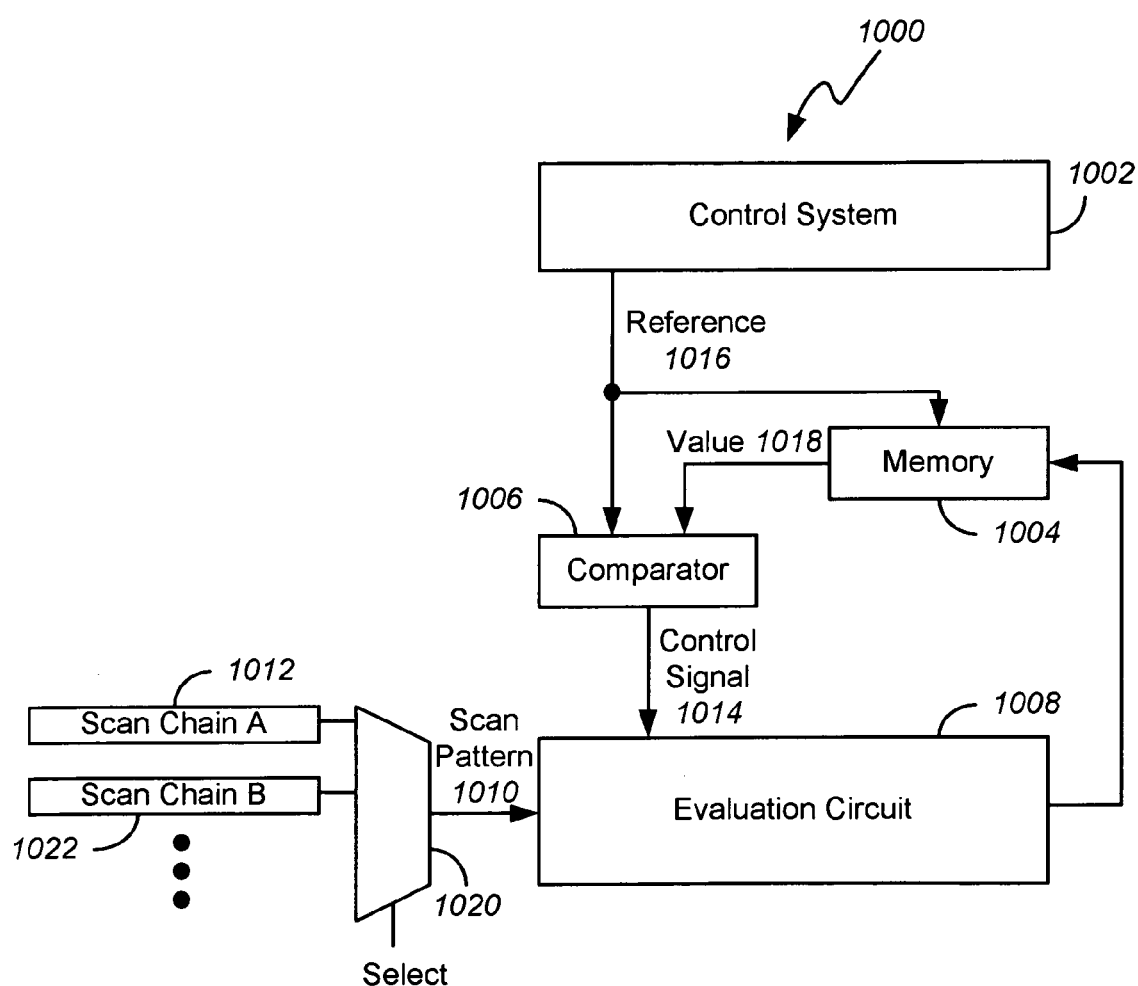
FIG. 10 illustrates first exemplary apparatus for implementing the method shown in FIG. 8 or FIG. 9 (or other methods)

FIG. 10 illustrates first exemplary apparatus 1000 for implementing the method 800 or the method 900. The apparatus 1000 comprises a control system 1002, a memory 1004, a comparator 1006 and an evaluation circuit 1008. The control system 1002 is configured to get or maintain a reference to a portion of a scan pattern 1010 that is currently being evaluated by the apparatus 1000. The memory 1004 is configured to store a value that represents an estimated position of a stuck-at defect in a scan chain 1012. The comparator

1006 is configured to assert a control signal 1014 when the reference 1016 has a predetermined relationship to the value 1018. The evaluation circuit 1008 is configured to 1) receive the scan pattern 1010 as it is shifted out of the scan chain 1012, 2) evaluate the scan pattern 1010 in real-time for the existence of a logic condition, and 3) upon identifying the existence of the logic condition when the control signal 1014 is asserted, cause the value stored in the memory 1004 to be overwritten using the reference 1016 that is got or maintained by the control system 1002.

As illustrated by the optional multiplexer 1020, the apparatus 1000 may be associated with different ones of a plurality of scan chains 1012, 1022, to evaluate each of the scan chains 1012, 1022, in turn, for a stuck-at defect. Alternately, the apparatus 1000 may be replicated for each of the scan chains 1012, 1022

Figure 11:
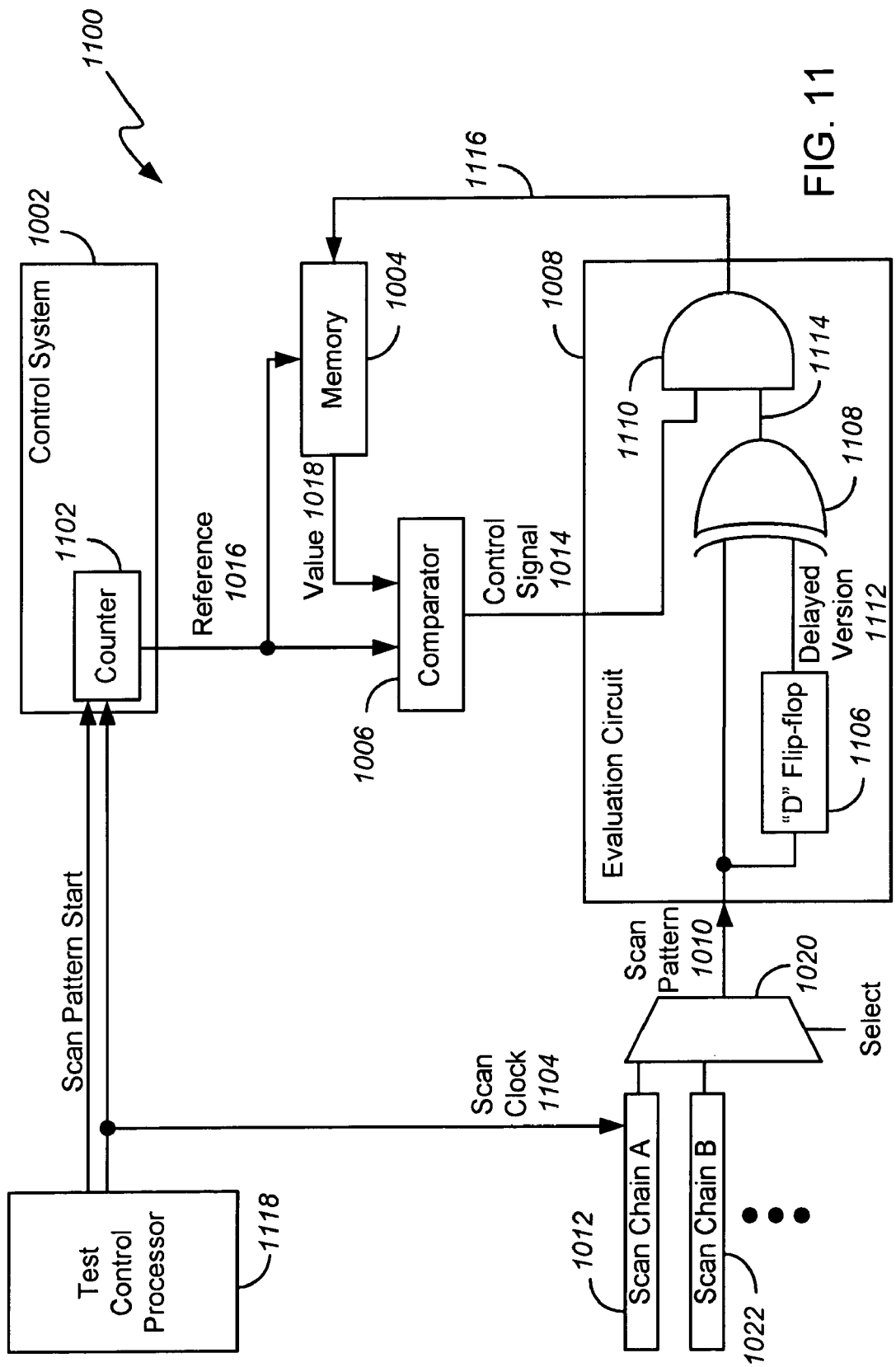
FIG. 11 illustrates second exemplary apparatus for implementing the method shown in FIG. 8 or FIG. 9 (or other methods)

FIG. 11 illustrates a more detailed implementation 1100 of the apparatus 1000, wherein the evaluation circuit 1008 is configured to evaluate a scan pattern for the existence of both high-to-low and low-to high logic transitions. Of note, in the following description, an indication that two components are "coupled" is intended to mean that the two components are either directly coupled (e.g., via a wire or signal trace, or via a passive device such as a resistor or a diode) or indirectly coupled (e.g., via a control or delay element).

As shown in FIG. 11, the control system 1002 may comprise a counter 1102, such that the reference 1016 maintained by the control system 1002 is a count maintained by the counter 1102. In some embodiments, the control system 1002 may cause the counter 1102 to increment its count in response to a scan clock 1104 that is used to shift the bits of the scan pattern 1010 out of the scan chain 1012. For purposes of this description, an "increment" operation is intended to include any operation that causes advancement in a predetermined count pattern, whether the count pattern is an up-count, a down-count, or a predetermined out-of-order count. However, for the sake of simplicity, it is expected that the count maintained by the counter 1102 will most often be implemented as an up-count or a down-count.

If the apparatus 1100 is used to evaluate multiple scan patterns for a single scan chain 1012 (which will often be the case), the control system 1002 may be configured to reset the counter 1102 before each of a plurality of scan patterns is shifted out of the scan chain 1012. This may be accomplished with the aid of a test system's test control processor 1118 (i.e., a processor that coordinates scan testing of a device under test and is therefore aware of when new scan patterns are being shifted into or out of a device under test).

By way of example, the memory 1004 may take the form of a serially-loaded register, a parallel-loaded register, an addressable location (or locations) in a larger memory, or any other means for storing a value representing the position of a stuck-at defect. The control system 1002 may be configured to initialize the memory 1004 prior to a plurality of scan patterns being evaluated by the evaluation circuit 1008. However, when the plurality of scan patterns is used to estimate the location of a stuck-at defect in a single scan chain, the memory 1004 should not be initialized between the evaluations of individual ones of the plurality of scan patterns.

The comparator 1006 has inputs that are respectively coupled to the control system 1002 (to receive the reference 1016) and to the memory 1004 (to receive the value 1018). The comparator 1006 compares the reference 1016 to the value 1018 and asserts a control signal 1014 when the reference 1016 and the value 1018 have a predetermined relationship. The nature of the "predetermined relationship" can take various forms. For example, if the counter 1102 maintains a sequential binary up-count (e.g., xxxxxx00, xxxxxx01, xxxxxx10, xxxxxx11, etc.), the relationship that causes the comparator 1006 to assert the control signal 1014 may be:

$$\text{reference 1016} > \text{value 1018} \qquad (Eq.\ 1)$$

However, if the counter 1102 maintains a sequential binary down-count, the relationship that causes the comparator 1006 to assert the control signal 1014 may be:

$$\text{reference 1016} < \text{value 1018} \qquad (Eq.\ 2)$$

The evaluation circuit 1008 is shown in FIG. 11 to comprise a flip-flop 1106, a logic XOR (exclusive-OR) gate 1108, and a logic AND gate 1110. The flip-flop 1106 is configured to receive and output a one-bit delayed version 1112 of the scan pattern 1010, and in some cases, the flip-flop 1106 may be triggered by means of the scan clock 1104. The logic XOR gate 1108 has a first input that is configured to receive the scan pattern 1010, a second input that is configured to receive the one-bit delayed version 1112 of the scan pattern 1010, and an XOR output 1114. The logic AND gate 1110 has a first input that is configured to receive the XOR output 1114, a second input that is configured to receive the control signal 1014, and an output 1116 that is coupled to a load input of the memory 1004. The evaluation circuit 1008 shown in FIG. 11 serves to compare logic levels of adjacent bits of the scan pattern 1010; and upon there being a difference (or logic transition) when the control signal 1014 is asserted, the evaluation circuit 1008 causes the value stored in the memory 1004 to be overwritten with the current value of the reference 1016. In this manner, the estimated position of a stuck-at defect in the scan chain 1012 is updated.

In some embodiments, the control system 1002 of the apparatus 1100 may be further configured to read the value that is in the flip-flop 1106 after a final bit in a scan pattern (or set of scan patterns) has been received by the flip-flop 1106. By reading the value of the final bit of a scan pattern 1010 that is shifted out of the scan chain 1012, the type of stuck-at defect in the scan chain 1012 may be determined. That is, it may be determined, for example, whether the stuck-at defect is a "stuck high" or "stuck low" type of defect.

In an alternate embodiment of the apparatus 1100 shown in FIG. 11, the flip-flop 1106 may be replaced with a delay circuit comprised of, for example, one or more buffers. The flip-flop 1106, however, provides good alignment of the scan pattern 1010 and the one-bit delayed version 1112 of the scan pattern 1010.

Figure 12:
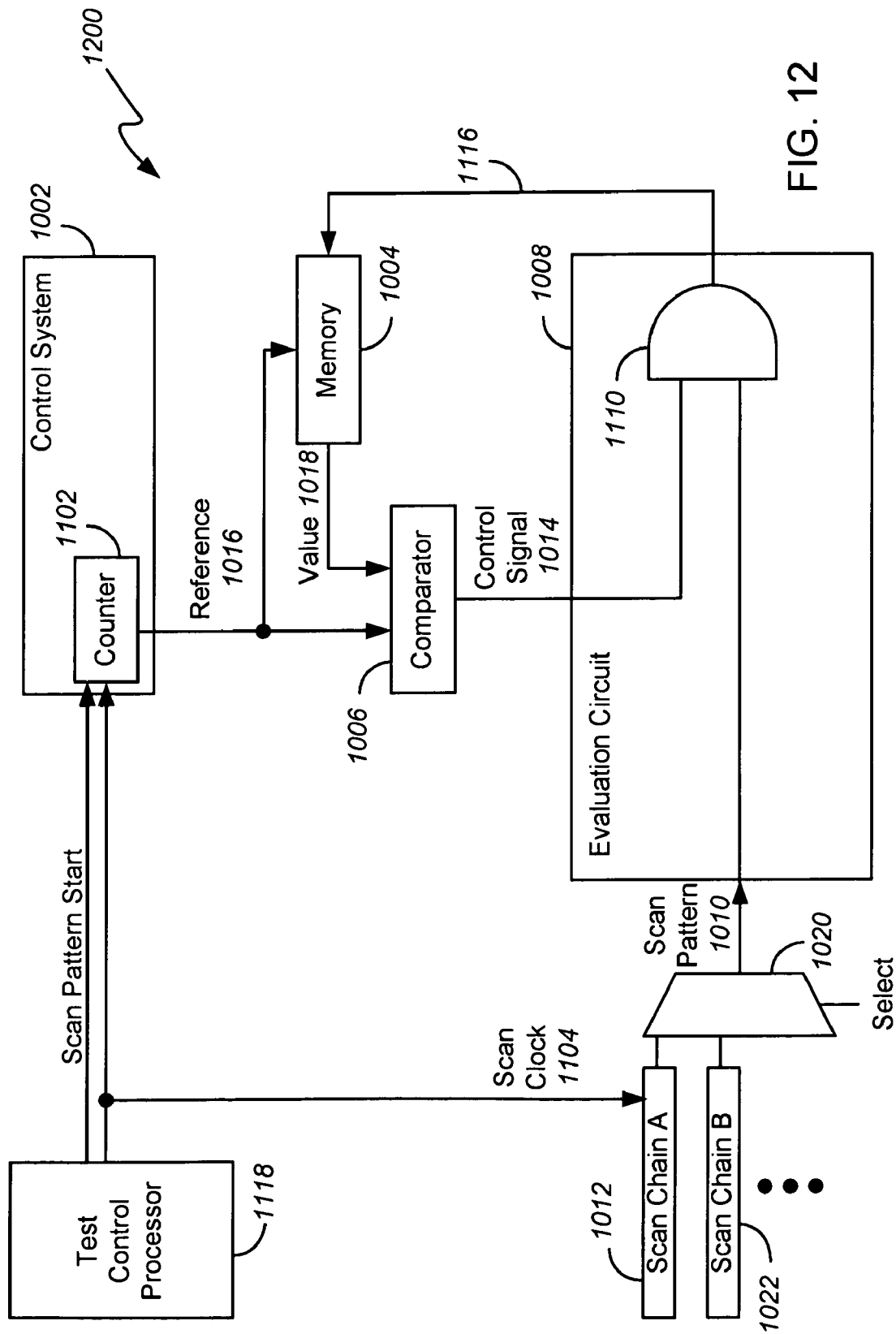
FIG. 12 illustrates third exemplary apparatus for implementing the method shown in FIG. 8 or FIG. 9 (or other methods)
Figure 13:
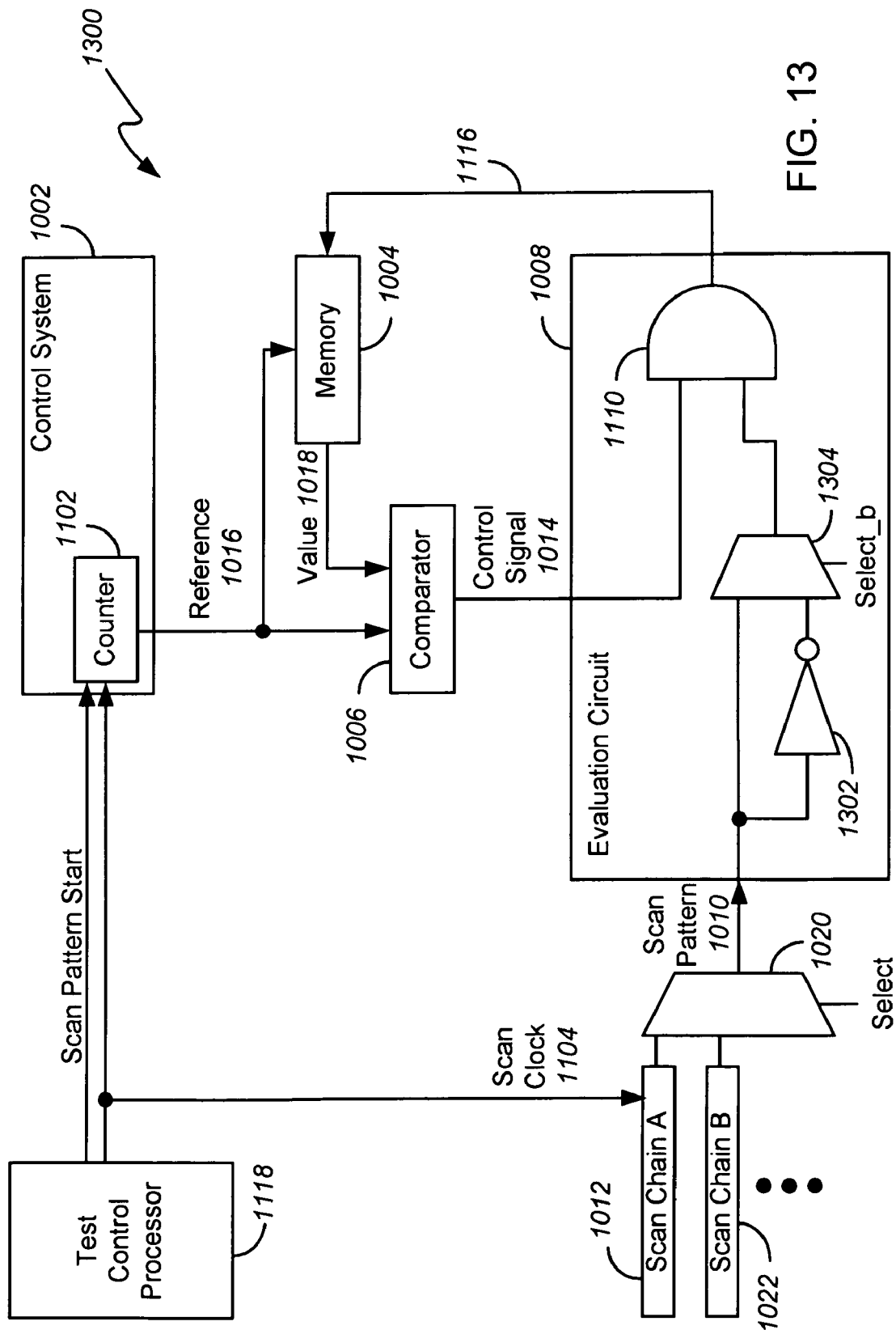
FIG. 13 illustrates fourth exemplary apparatus for implementing the method shown in FIG. 8 or FIG. 9 (or other methods)

FIG. 12 illustrates a second exemplary implementation 1200 of the apparatus 1000, wherein the evaluation circuit 1008 is configured to evaluate a scan pattern for the existence of a particular logic level. The apparatus 1200 may be constructed similarly to the apparatus 1100 (FIG. 11), but for the configuration of the evaluation circuit 1008. In FIG. 12, the evaluation circuit 1008 simply comprises a logic AND gate 1110. The logic AND gate 1110 has a first input that is configured to receive the scan pattern 1010, a second input that is configured to receive the control signal 1014, and an output 1116 that is coupled to a load input of the memory 1004. The evaluation circuit 1008 shown in FIG. 12 serves to identify the existence of a logic high level in the scan pattern 1010; and upon the logic high level being identified when the control signal 1014 is asserted, the evaluation circuit 1008 causes the value stored in the memory 1004 to be overwritten with the current value of the reference 1016. In this manner, the estimated position of a "stuck low" defect in the scan chain 1012 is updated. If an inverter is inserted between the output of the scan chain 1012 and the logic AND gate 1110, the apparatus 1200 can be used to estimate the position of a "stuck high" defect in the scan chain 1012. Alternately, and as shown in FIG. 13, the evaluation circuit 1008 of the apparatus 1200 shown in FIG. 12 may be modified to include both an inverter 1302 and a multiplexer 1304. If the control system 1002 is configured to control the select input of the multiplexer 1304, the apparatus 1300 (FIG. 13) may be used to estimate the position of a stuck low or stuck high defect.

Figure 9:
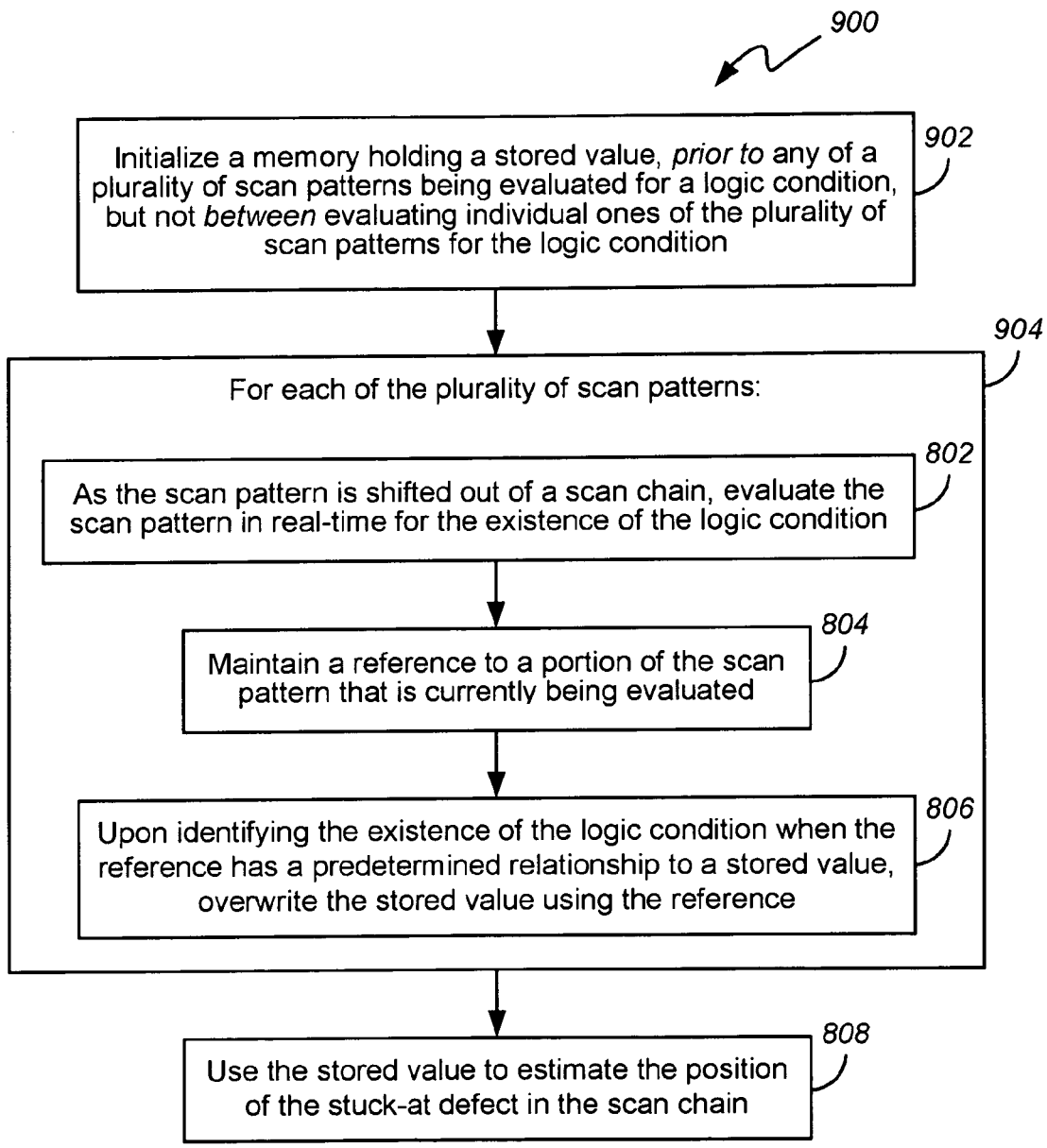
FIG. 9 illustrates a second exemplary method for estimating a position of a stuck-at defect in a scan chain.
Figure 14:
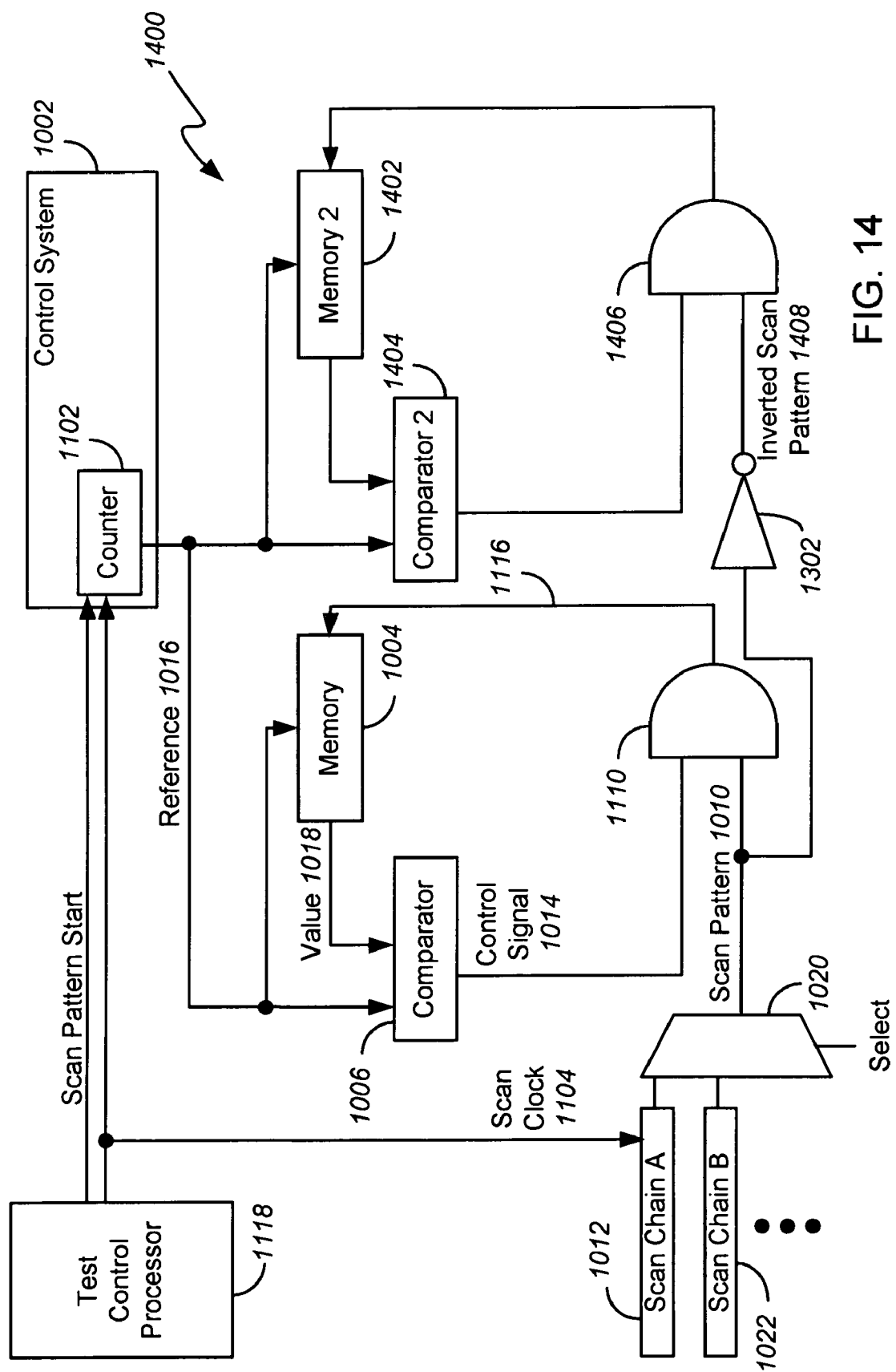
FIG. 14 illustrates fifth exemplary apparatus for implementing the method shown in FIG. 8 or FIG. 9 (or other methods)

FIG. 14 illustrates yet another way to implement the method 800 (FIG. 8) or the method 900 (FIG. 9). The apparatus 1400 is similar to the apparatus 1300 shown in FIG. 13, in that the apparatus 1400 can also estimate the positions of stuck low and stuck high defects. However, in lieu of the multiplexer 1302, the apparatus 1400 replicates the memory 1004, comparator 1006 and logic AND gate 1110 to provide a second memory 1402, second comparator 1404 and second AND gate 1406. The scan pattern 1010 is then provided to an input of the logic AND gate 1110, and an inverted scan pattern 1408 is provided to the logic AND gate 1406 (by means of the inverter 1302). After evaluation of one or more scan patterns for logic high and logic low levels, the memories 1004 and 1402 can be read to determine the positions of the last logic low level and last logic high level emitted from a scan chain. If the scan chain has a stuck-at defect, then the position that is closest to the output of the scan chain represents the estimated position of the stuck-at defect.

In the apparatus 1100, 1200, 1300, 1400 shown in FIGS. 11-14, the control system 1002 uses a counter 1102 to maintain a reference to a portion of the scan pattern being evaluated. However, and by way of example, the control system 1002 could alternately be configured to get the "reference" by reading or acquiring a current bit position of a shifted-out scan pattern from a test system's test control processor. Of note, the reference that is got or maintained by the control system 1002 may in some cases be 1) the current bit position that is being evaluated by the evaluation circuit 1008, 2) a bit position that borders a transition that is being evaluated by the evaluation circuit 1008, or 3) a count that has a known relationship to the bit position or transition that is being evaluated.

Figure 15:
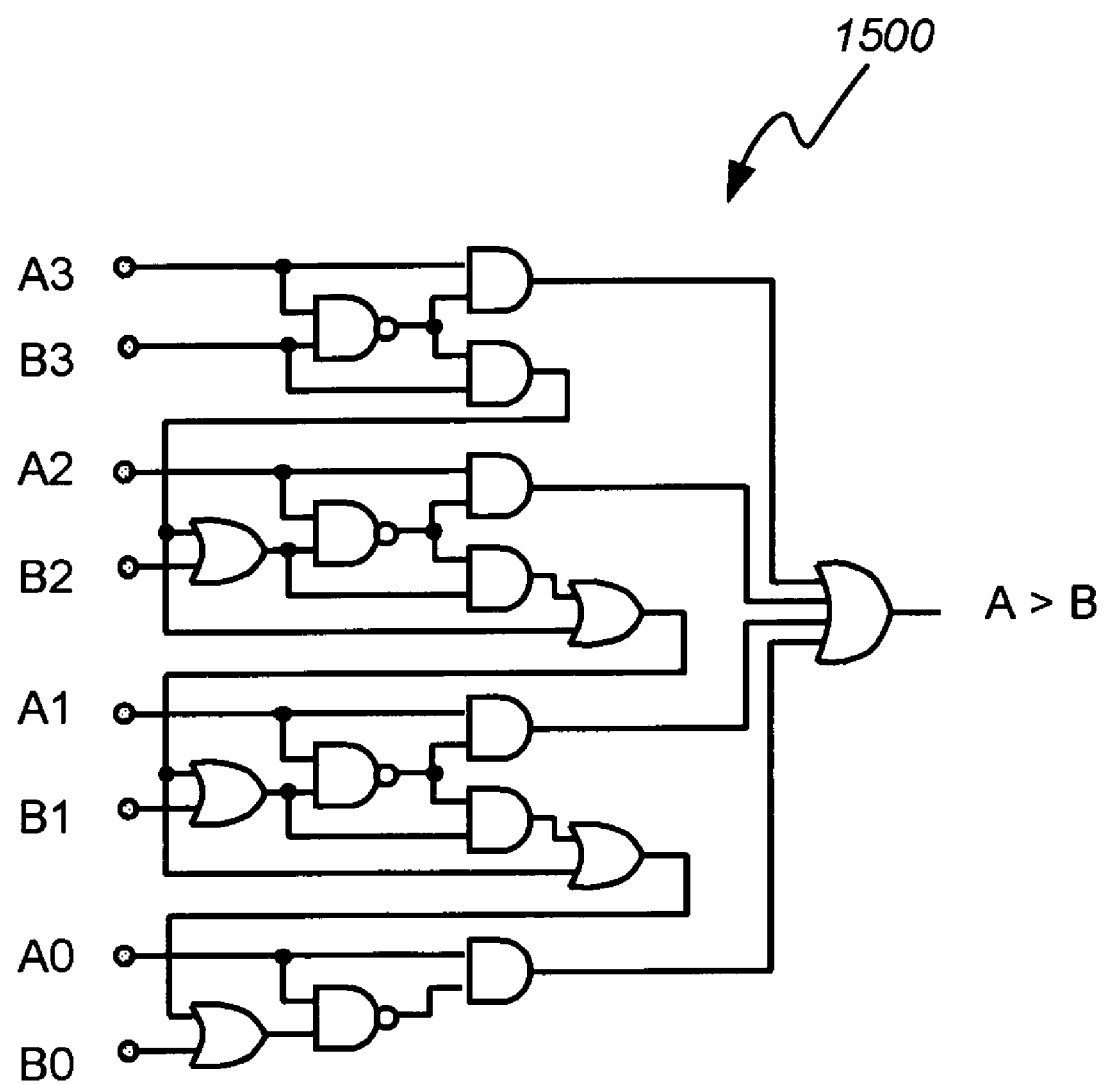
FIG. 15 illustrates an exemplary type of comparator that may be employed by the apparatus shown in FIGS. 10, 11, 12, 13 or 14.

FIG. 15 illustrates one exemplary embodiment 1500 of the comparator 1006 or 1404 shown in FIGS. 10-14. The comparator 1500 comprises a plurality of logic gates that, together, receive the inputs A (comprised of bits A3, A2, A1 and A0) and B (comprised of bits B3, B2, B1 and B0) and generate an output indicative of whether A>B. Alternately, the comparator 1006 or 1404 could be implemented using any of a wide range of devices and structures that are capable of comparing two values.

Figure 16:
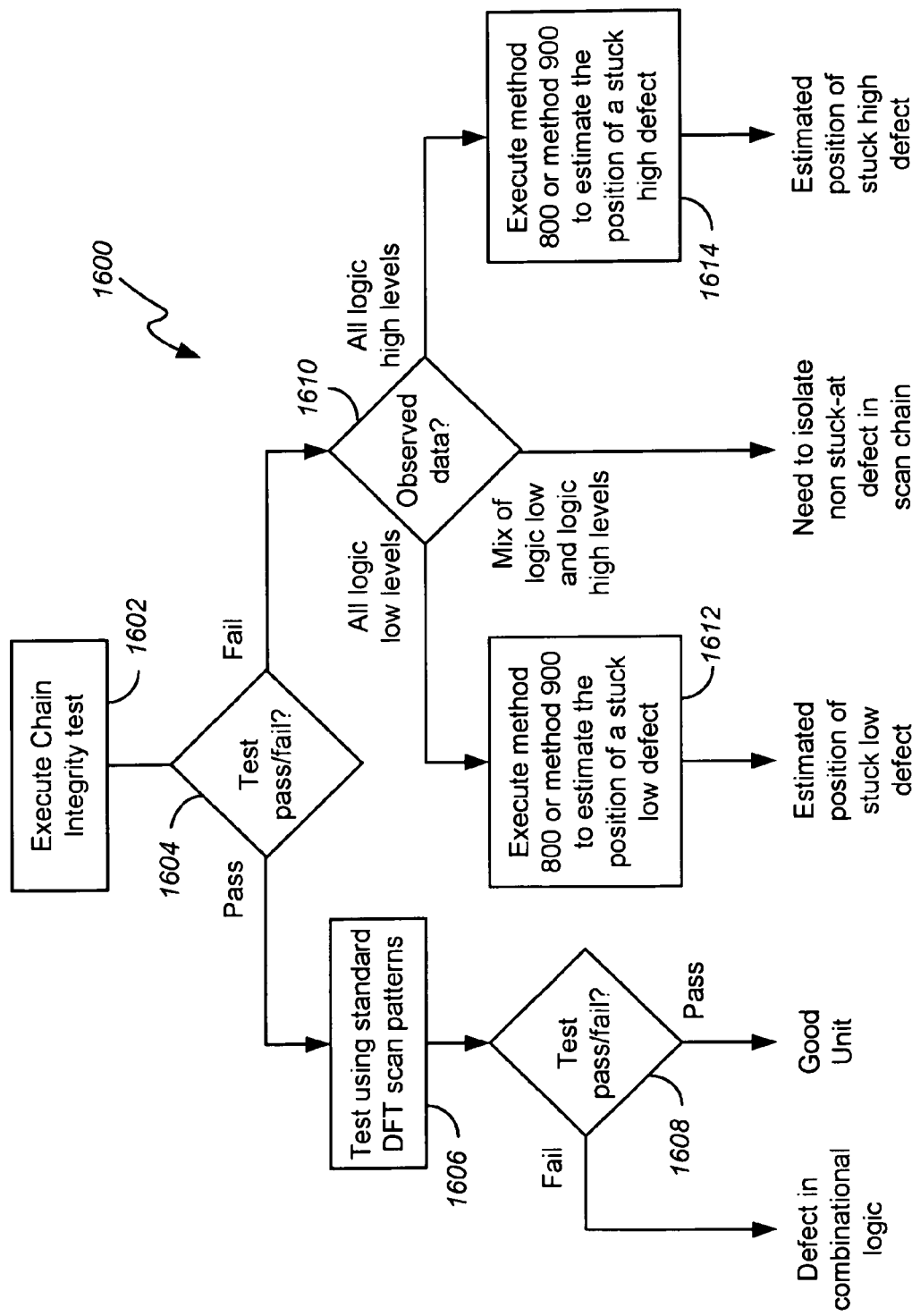
FIG. 16 illustrates an exemplary method for testing and isolating faults in a scan chain.

FIG. 16 illustrates a method 1600 for testing and isolating faults in a scan chain. As will become clear, the method 800 or 900 may be launched during execution of the method 1600. The method 1600 begins with the execution of a "Chain Integrity" test (at block 1602). The chain integrity test may comprise shifting a scan pattern (e.g. "11001100 . . . ") into and out of a scan chain, without launching the scan pattern to the combinational logic of a DUT. If the scan pattern is shifted out of the scan chain n cycles after it is shifted in (with "n" being the number of flip-flops in the scan chain), the Chain Integrity test is deemed to "pass" (at block 1604). Otherwise, the Chain Integrity test "fails". If the Chain Integrity test passes, then standard DFT scan patterns are used to test the DUT (at block 1606), and a determination is made as to whether the DUT passes or fails scan testing (at block 1608).

If the Chain Integrity test fails, then it is determined whether the scan pattern shifted out of the scan chain during the Chain Integrity test comprised: all logic low levels, all logic high levels, or a mix of logic low and logic high levels. If the latter, the scan chain is determined not to have a stuck-at fault (at block 1610). If the shifted out scan pattern comprises all logic low levels, then the method 800 or method 900 (FIG. 8 or 9) can be executed to estimate the position of a stuck low defect (at block 1612). If the shifted out scan pattern comprises all logic high levels, then the method 800 or method 900 can be executed to estimate the position of a stuck high defect (at block 1614).

What is claimed is:

1. A method for estimating a position of a stuck-at defect in a scan chain of a device under test, comprising:
    as a scan pattern is shifted out of the scan chain, evaluating the scan pattern in real-time for existence of a logic condition;
    maintaining a reference to a portion of the scan pattern that is currently being evaluated;
    upon identifying the existence of the logic condition when the reference has a predetermined relationship to a stored value, overwriting the stored value using the reference; and
    using the stored value to estimate the position of the stuck-at defect in the scan chain.

2. The method of claim 1, wherein the reference is maintained by updating a count.

3. The method of claim 1, wherein the logic condition is a logic level.

4. The method of claim 1, wherein the logic condition is a logic transition.

5. The method of claim 4, wherein the scan pattern is evaluated for the existence of the logic condition by comparing logic levels of adjacent bits of the scan pattern.

6. The method of claim 4, further comprising:
    reading a value of a final bit of the scan pattern shifted out of the scan chain; and
    using the value of the final bit to determine a type of the stuck-at defect.

7. The method of claim 1, wherein the predetermined relationship is the reference being greater than the stored value.

8. The method of claim 1, further comprising:
    repeating the evaluating, maintaining, identifying and overwriting steps for each of a plurality of scan patterns shifted out of the scan chain; and
    initializing a memory holding the stored value, prior to any of the plurality of scan patterns being evaluated for the logic condition, but not between evaluating individual ones of the plurality of scan patterns for the logic condition;
    wherein the stored value is used to estimate the position of the stuck-at defect in the scan chain after repeating the evaluating, maintaining, identifying and overwriting steps for each of the plurality of scan patterns.

9. Apparatus for estimating a position of a stuck-at defect in a scan chain of a device under test, comprising:
    a control system configured to get or maintain a reference to a portion of a scan pattern that is currently being evaluated by the apparatus;
    a memory configured to store a value, the value representing an estimated position of the stuck-at defect;
    a comparator configured to assert a control signal when the reference has a predetermined relationship to the value stored in the memory; and
    an evaluation circuit configured to i) receive the scan pattern as it is shifted out of the scan chain, ii) evaluate the scan pattern in real-time for existence of a logic condition, and iii) upon identifying the existence of the logic condition when the control signal is asserted, cause the value stored in the memory to be overwritten using the reference.

10. The apparatus of claim 9, wherein the control system comprises a counter, wherein the reference is a count maintained by the counter, wherein bits in the scan pattern are shifted out of the scan chain in response to a scan clock, and wherein the control system causes the counter to increment the count in response to the scan clock.

11. The apparatus of claim 10, wherein the control system is configured to reset the counter before each of a plurality of scan patterns is shifted out of the scan chain.

12. The apparatus of claim 9, wherein the control system is further configured to initialize the memory prior to a plurality of scan patterns being evaluated by the evaluation circuit, but not between the evaluations of individual ones of the plurality of scan patterns.

13. The apparatus of claim 9, wherein the evaluation circuit comprises a logic AND gate having a first input configured to receive the scan pattern, a second input configured to receive the control signal, and an output coupled to a load input of the memory.

14. The apparatus of claim 9, wherein the evaluation circuit comprises:
   an inverter configured to receive the scan pattern and produce an inverted scan pattern; and
   a logic AND having a first input configured to receive the inverted scan pattern, a second input configured to receive the control signal, and an output coupled to a load input of the memory.

15. The apparatus of claim 9, wherein the evaluation circuit comprises:
   a flip-flop configured to receive and output a one-bit delayed version of the scan pattern;
   a logic XOR gate having a first input configured to receive the scan pattern, a second input configured to receive the one-bit delayed version of the scan pattern, and an XOR output; and
   a logic AND gate having a first input configured to receive the XOR output, a second input configured to receive the control signal, and an output coupled to a load input of the memory.

16. The apparatus of claim 9, wherein the evaluation circuit comprises:
   a delay circuit, configured to receive and output a one-bit delayed version of the scan pattern;
   a logic XOR gate having a first input configured to receive the scan pattern, a second input configured to receive the one-bit delayed version of the scan pattern, and an XOR output; and
   a logic AND gate having a first input configured to receive the XOR output, a second input configured to receive the control signal, and an output coupled to a load input of the memory.

17. The apparatus of claim 16, further comprising a control system configured to read a value in the flip-flop after a final bit in the scan pattern has been received by the flip-flop.

18. The apparatus of claim 16, wherein the counter has a reset input, and wherein the apparatus further comprises a control system configured to i) reset the current bit position, via the reset input, before each of a plurality of scan patterns is shifted out of the scan chain, and ii) read and store a value in the flip-flop after a final bit in the plurality of scan patterns has been received by the flip-flop.

19. The apparatus of claim 9, wherein the logic condition is a logic level.

20. The apparatus of claim 9, wherein the logic condition is a logic transition.

21. Apparatus for estimating a position of a stuck-at defect in a scan chain of a device under test, comprising:
   means for storing a value representing the position of the stuck-at defect;
   means for, as a scan pattern is shifted out of the scan chain, evaluating the scan pattern in real-time for existence of a logic condition;
   means for maintaining a reference to a portion of the scan pattern that is currently being evaluated; and
   means for, upon identifying the existence of the logic condition when the reference has a predetermined relationship to a stored value, overwriting the stored value using the reference.

* * * * *